(12) United States Patent
Yang et al.

(10) Patent No.: US 12,004,380 B2
(45) Date of Patent: Jun. 4, 2024

(54) ORGANIC LIGHT-EMITTING DIODE DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Weiwei Yang, Hubei (CN); Cheng Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 985 days.

(21) Appl. No.: 16/964,802

(22) PCT Filed: Apr. 30, 2020

(86) PCT No.: PCT/CN2020/088058
§ 371 (c)(1),
(2) Date: Jul. 24, 2020

(87) PCT Pub. No.: WO2021/164132
PCT Pub. Date: Aug. 26, 2021

(65) Prior Publication Data
US 2023/0172009 A1 Jun. 1, 2023

(30) Foreign Application Priority Data
Feb. 17, 2020 (CN) .......................... 202010097487.5

(51) Int. Cl.
H10K 59/124 (2023.01)
H10K 59/12 (2023.01)

(52) U.S. Cl.
CPC ....... *H10K 59/124* (2023.02); *H10K 59/1201* (2023.02)

(58) Field of Classification Search
CPC .. H10K 59/124; H10K 59/1201; H10K 71/00; H10K 50/80; H10B 12/033; H10B 12/377; H01L 23/5223; H01L 21/82345
See application file for complete search history.

(56) References Cited

U.S. PATENT DOCUMENTS

2005/0236629 A1 10/2005 Lee et al.
2005/0264188 A1* 12/2005 Huang .................. H10K 59/35
313/506

(Continued)

FOREIGN PATENT DOCUMENTS

CN 104008999 A 8/2014
CN 108198950 A 6/2018

(Continued)

*Primary Examiner* — Victor A Mandala
*Assistant Examiner* — Lawrence C Tynes, Jr.
(74) *Attorney, Agent, or Firm* — PV IP PC; Wei Te Chung; Zhigang Ma

(57) ABSTRACT

The present invention provides an organic light-emitting diode display device and a manufacturing method thereof. An inorganic insulating layer covering a gate is formed, and an organic insulating layer is formed on the inorganic insulating layer, which prevents a problem of metal residue occurring in a subsequently formed metal layer during etching due to a steep slope. A groove is defined on a position of the organic insulating layer corresponding to the gate, and a metal component for forming a capacitor with the gate is formed in the groove and disposed corresponding to the gate.

18 Claims, 4 Drawing Sheets

(56) References Cited

U.S. PATENT DOCUMENTS

| | | |
|---|---|---|
| 2013/0137212 A1 | 5/2013 | Ha et al. |
| 2016/0233253 A1* | 8/2016 | Kim .................. H01L 29/78696 |
| 2018/0248045 A1* | 8/2018 | Lim ................... H01L 27/1222 |
| 2021/0005134 A1* | 1/2021 | Kishimoto ........... H10K 50/814 |

FOREIGN PATENT DOCUMENTS

| | | |
|---|---|---|
| CN | 108231839 A | 6/2018 |
| CN | 108899342 A | 11/2018 |
| CN | 109155328 A | 1/2019 |

* cited by examiner

ORGANIC LIGHT-EMITTING DIODE DISPLAY DEVICE AND MANUFACTURING METHOD THEREOF

FIELD OF INVENTION

The present disclosure relates to the field of display technology, and more particularly, to an organic light-emitting diode display device and a manufacturing method thereof.

BACKGROUND OF INVENTION

Organic light-emitting diode (OLED) display devices are more and more widely used due to advantages of light weight, self-luminosity, wide viewing angles, low driving voltage, high luminous efficiency, low power consumption, and fast response times.

In prior art, scanning lines of the organic light-emitting diode display devices are made of molybdenum. Due to a greater resistivity of molybdenum, in wide-screen organic light-emitting diode display devices, the scanning lines made of molybdenum will cause delay of gate drive signals to be more obvious. Therefore, metal materials with a lower resistance are required to solve the delay problem of the gate drive signals. The metal materials with a lower resistivity include aluminum. A metal layer with lower resistivity is patterned by dry etching to form a steeper slope when forming a gate of thin film transistors. Moreover, a thickness of a subsequent inorganic insulating layer covering the gate is relatively thin, which may cause metal residue to occur at the steep slope of the metal layer that is subsequently formed on the inorganic insulating layer and needs to be partially etched to form a patterned metal layer, and the metal residue will reduce performance of the organic light-emitting diode display devices.

SUMMARY OF INVENTION

A purpose of the present disclosure is to provides an organic light-emitting diode display device and a manufacturing method thereof to solve the problem that metal residue occur at a steep slope of a metal layer used to form a metal component during etching, and simultaneously ensure that the capacitor consisted of the gate and the metal component has a greater capacitance.

For an organic light-emitting diode display device, the organic light-emitting diode display device comprises a substrate, an active layer formed on the substrate, a first insulating layer covering the active layer and the substrate, a gate disposed corresponding to the active layer and formed on the first insulating layer, an inorganic insulating layer covering the gate and the first insulating layer, an organic insulating layer comprising a groove and formed on the inorganic insulating layer, wherein the groove is defined corresponding to the gate, a metal component formed in the groove and disposed corresponding to the gate, a second insulating layer at least covering the metal component and the organic insulating layer, a source and a drain formed on the second insulating layer and electrically connected to the active layer through a through-hole at least penetrating through the second insulating layer, the first insulating layer, and the inorganic insulating layer; and a light-emitting device layer formed on a side of the source and the drain away from the substrate.

In the above organic light-emitting diode display device, a depth of the groove is equal to a thickness of the organic insulating layer.

In the above organic light-emitting diode display device, a thickness of the inorganic insulating layer ranges from 500 Å to 2000 Å, and the inorganic insulating layer is a silicon nitride layer.

In the above organic light-emitting diode display device, a vertical projection of the metal component on the substrate covers a vertical projection of the gate on the substrate, and a size of the metal component is greater than a size of the gate.

In the above organic light-emitting diode display device, the active layer comprises a source contact region and a drain contact region arranged symmetrically with the source contact region. At least two first openings are defined on the organic insulating layer, and the at least two first openings are defined corresponding to a portion of the source contact region and a portion of the drain contact region respectively which correspond to the active layer. The at least two first openings are connected to the through-hole penetrating through the second insulating layer, the first insulating layer, and the inorganic insulating layer. The source and the drain contact the portion of the source contact region and the portion of the drain contact region which correspond to the active layer through the at least two first openings and the through-hole penetrating through the second insulating layer, the first insulating layer, and the inorganic insulating layer respectively.

In the above organic light-emitting diode display device, a longitudinal section of the groove is an inverted trapezoid.

In the above organic light-emitting diode display device, a thickness of the organic insulating layer ranges from 0.5 micron to 3 microns.

In the above organic light-emitting diode display device, the gate comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer, and the metal component comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer.

In the above organic light-emitting diode display device, the light-emitting diode display device comprises a planarization layer and a pixel definition layer, the light-emitting device layer comprises an anode, an organic light-emitting layer, and a cathode, the planarization layer covers the source, the drain, and the second insulating layer and comprises the through-hole. The anode is formed on the planarization layer and electrically contacts the drain through the through-hole on the planarization layer. The pixel definition layer covers the anode and the planarization layer and comprises a second opening, and the second opening is defined corresponding to the anode. The organic light-emitting layer is formed in the second opening and is located on the anode. The cathode at least covers the organic light-emitting layer.

For a manufacturing method of an organic light-emitting diode display device, the manufacturing method of the organic light-emitting diode display device comprises a plurality of steps as follows: forming an active layer on a substrate; forming a first insulating layer covering the active layer and the substrate; forming a gate corresponding to the active layer on the first insulating layer; forming an inorganic insulating layer covering the gate and the first insulating layer; forming an organic insulating layer comprising a groove on the inorganic insulating layer, wherein the groove is defined corresponding to the gate; forming a metal component in the groove, wherein the metal component is disposed corresponding to the gate; forming a second insulating layer at least covering the metal component and the organic insulating layer; forming a source and a drain on the second insulating layer, wherein the source and the drain are electrically connected to the active layer through a through-hole at least penetrating through the second insulating layer, the first insulating layer, and the inorganic insulating layer; and forming a light-emitting device layer on a side of the source and the drain away from the substrate.

In the above manufacturing method of the organic light-emitting diode display device, a depth of the groove is equal to a thickness of the organic insulating layer.

In the above manufacturing method of the organic light-emitting diode display device, a thickness of the inorganic insulating layer ranges from 500 Å to 2000 Å, and the inorganic insulating layer is a silicon nitride layer.

In the above manufacturing method of the organic light-emitting diode display device, a vertical projection of the metal component on the substrate covers a vertical projection of the gate on the substrate, and a size of the metal component is greater than a size of the gate.

In the above manufacturing method of the organic light-emitting diode display device, the method further comprises a following step: defining at least two first openings on the organic insulating layer, wherein the at least two first openings are defined corresponding to a portion of a source contact region and a portion of the drain contact region respectively which correspond to the active layer, and the active layer comprises the source contact region and the drain contact region arranged symmetrically with the source contact region.

In the above manufacturing method of the organic light-emitting diode display device, a longitudinal section of the groove is an inverted trapezoid.

In the above manufacturing method of the organic light-emitting diode display device, a thickness of the organic insulating layer ranges from 0.5 micron to 3 microns.

In the above manufacturing method of the organic light-emitting diode display device, the gate comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer, and the metal component comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer.

In the above manufacturing method of the organic light-emitting diode display device, the method further comprises a following step: forming a planarization layer comprising the through-hole and covering the source, the drain, and the second insulating layer.

The step of forming the light-emitting device layer on the side of the source and the drain away from the substrate comprises a following step: forming an anode on the planarization layer, wherein the anode is electrically connected to the drain through the through-hole The method further comprises a following step: forming a pixel definition layer comprising a second opening and covering the anode and the planarization layer and, wherein the second opening is defined corresponding to the anode The step of forming the light-emitting device layer on the side of the source and the drain away from the substrate further comprises a plurality of steps as follows: forming the organic light-emitting layer in the second opening, wherein the organic light-emitting layer is located on the anode; and forming a cathode at least covering the organic light-emitting layer.

The present disclosure provides the organic light-emitting diode display device and the manufacturing method thereof. The inorganic insulating layer is formed to cover the gate, and the organic insulating layer is formed on the inorganic insulating layer to perform a planarization function, which prevents the problem of metal residue occurring in a subsequently formed metal layer during etching due to a steep slope. The groove is defined at a position of the organic insulating layer corresponding to the gate, and the metal component for forming a capacitor with the gate is formed in the groove and disposed corresponding to the gate, so that an interval between the gate and the metal component is reduced and a capacitance of the capacitor consisted of the gate and the metal component is greater.

DETAILED DESCRIPTION OF PREFERRED EMBODIMENTS

The technical solutions in the embodiments of the present disclosure will be clearly and completely described below in conjunction with accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

Figure 1:
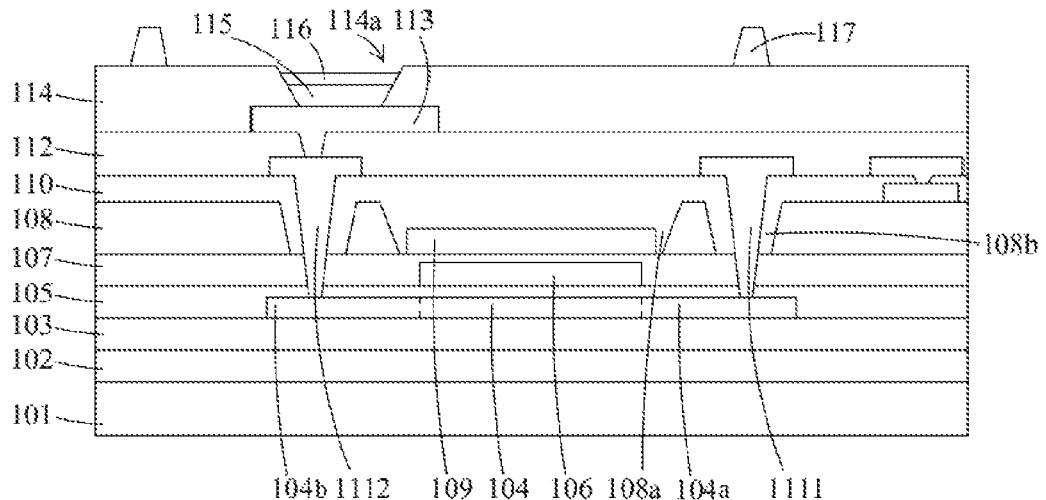
FIG. 1 is a schematic structural diagram of an organic light-emitting diode display device in an embodiment of the present disclosure.

Refer to FIG. 1, FIG. 1 is a schematic structural diagram of an organic light-emitting diode display device in an embodiment of the present disclosure. The organic light-emitting diode display device 10 is a top-emitting organic light-emitting diode display device. It could be understood that the organic light-emitting diode display device 10 may also be a bottom-emitting organic light-emitting diode display device. The organic light-emitting diode display device 10 comprises a substrate 101, a blocking layer 102, a buffer layer 103, an active layer 104, a first insulating layer 105, a gate 106, an inorganic insulating layer 107, an organic insulating layer 108, a metal component 109, a second insulating layer 110, a source 1111, a drain 1112, a planarization layer 112, an anode 113, a pixel definition layer 114, an organic light-emitting layer 115, a cathode 116, and a support component 117.

The substrate 101 is a carrier to carry a thin film transistor array layer and a light-emitting device layer, etc. The substrate 101 may be a glass substrate, or may be a transparent flexible polymer substrate such as a polyimide substrate. Specifically, the substrate 101 is a polyimide substrate.

The blocking layer 102 is configured to block water vapor and oxygen from entering a thin film transistor layer to prevent water vapor and oxygen from affecting performance of devices on the substrate 101. An entire surface of the blocking layer 102 is formed on the substrate 101. The blocking layer 102 is formed by one of chemical vapor deposition, plasma enhanced chemical vapor deposition, sputtering, vacuum evaporation, or low-pressure chemical vapor deposition. The blocking layer 102 is a silicon oxide layer, and a thickness of the blocking layer 102 ranges from 4000 Å to 6000 Å. It could be understood that the blocking layer 102 can have multiple layers; for example, the blocking layer 102 is an overlapping layer of silicon nitride and silicon oxide.

The buffer layer 103 is configured to prevent impurities in the substrate 101 from diffusing upward in subsequent processes and affecting quality of the subsequently formed active layer 104. An entire surface of the buffer layer 103 is formed on the blocking layer 102. The buffer layer 103 may be a silicon oxide layer, or a silicon nitride layer and a silicon oxide layer covering the blocking layer 102 in sequence, wherein a thickness of the silicon nitride layer ranges from 400 Å to 600 Å, and a thickness of the silicon oxide layer ranges from 2500 Å to 3500 Å. The buffer layer 103 can be formed by one of chemical vapor deposition, plasma enhanced chemical vapor deposition, sputtering, vacuum evaporation, or low-pressure chemical vapor deposition.

The active layer 104 is configured to transport carriers. The active layer 104 is formed on the substrate 101. Specifically, the active layer is formed on the buffer layer 103. An entire surface of amorphous silicon is formed on the buffer layer 103, the amorphous silicon is treated with excimer laser annealing (ELA) to convert the amorphous silicon to polysilicon, and the polysilicon is patterned to form the active layer by a first photolithography process. The first photolithography process comprises: forming an entire surface of a photoresist on a polysilicon layer; exposing the entire surface of the photoresist by a first photomask; removing a part of the photoresist by a developer; and etching the polysilicon not covered by the photoresist to remove the remaining photoresist, thereby obtaining the active layer 104. A thickness of the active layer 104 ranges from 400 Å to 600 Å.

The first insulating layer 105 is a first gate insulating layer, and is configured to insulate the active layer 104 and the subsequently formed gate 106. The first insulating layer 105 covers the active layer 104 and the substrate 101. Specifically, the first insulating layer 105 covers the active layer 104 and the buffer layer 103. The first insulating layer 105 is a silicon oxide layer. A thickness of the first insulating layer 105 ranges from 1000 Å to 1500 Å. The first insulating layer 105 is formed by one of chemical vapor deposition, vacuum evaporation, sputtering deposition, plasma enhanced chemical vapor deposition, or low-pressure chemical vapor deposition.

The gate 106 is formed on the first insulating layer 105 and disposed corresponding to the active layer 104. Specifically, an entire surface of a first metal layer is formed on the first insulating layer 105 by sputtering deposition, and the first metal layer is patterned to form the gate 106 and scanning lines by a second photolithography process. The second photolithography process is the same as the first photolithography process and will not be described herein. The first metal layer may be an aluminum layer (a thickness ranges from 1000 Å to 4000 Å) or an aluminum alloy layer (a thickness ranges from 1000 Å to 4000 Å); the first metal layer may also be a lamination of the aluminum alloy layer (a thickness ranges from 1000 Å to 4000 Å) and a titanium layer (a thickness ranges from 300 Å to 1000 Å) disposed on the first insulating layer 105 in sequence, and the first metal layer may also be a lamination of the aluminum alloy layer and a TiNx layer disposed on the first insulating layer in sequence. A material of the first metal layer can also be molybdenum or copper. Specifically, the gate comprises one of the aluminum layer, the aluminum alloy layer, the lamination of the aluminum layer and the titanium layer, the lamination of the aluminum alloy layer and the titanium layer, or the lamination of the aluminum alloy layer and the TiNx layer. When the first metal layer is a low-resistivity metal layer such as aluminum, the etched first metal layer will form a gate 106 with a steep slope. For a pixel driving circuit with a plurality of thin film transistors; for example, a pixel driving circuit with seven thin film transistors and one capacitor, a plurality of the gates 106 with steep slopes are formed.

After the gate 106 is formed, the active layer 104 is ion implanted with the gate 106 as a mask, so that a source contact region 104a and a drain contact region 104b are formed on both sides of the active layer 104, and the source contact region 104a and the drain contact region 104b are arranged symmetrically. The subsequently formed source 1111 and the drain 1112 form ohmic contacts with the polysilicon of the source contact region 104a and the polysilicon of the drain contact region 104b respectively. The active layer between the source contact region 104a and the drain contact region 104b is a channel.

The inorganic insulating layer 107 covers the gate 106 and the first insulating layer 105. The inorganic insulating layer 107 is a silicon nitride layer. A thickness of the inorganic insulating layer 107 ranges from 500 Å to 2000 Å. The thickness of the inorganic insulating layer 107 less than 500 Å is unconducive to a formation of the inorganic insulating layer with a uniform thickness, and the thickness of the inorganic insulating layer 107 greater than 2000 Å causes an interval between the gate 106 and the subsequently formed metal component 109 to be too wide, thereby making a capacitance of a capacitor formed by the two to be too small. Because the thickness of the inorganic insulating layer 107 is thin, the steep slope due to the gate cannot be planarized.

The organic insulating layer 108 is formed on the inorganic insulating layer 107, the organic insulating layer 108 comprises a groove 108a, and the groove 108a is defined corresponding to the gate 106. The organic insulating layer 108 and the inorganic insulating layer 107 constitute a second gate insulating layer. The organic insulating layer 108 is planarized, so that the steep slope caused by the gate 106 becomes planarized after covering the organic insulating layer 108. When a second metal layer subsequently formed on the organic insulating layer 108 needs to be etched to form the metal component 109, the second metal layer except the second metal layer located in the groove 108a is on the planarized organic insulating layer 108. Therefore, metal residue will not occur when etching the second metal layer on the planarized organic insulating layer 108.

In addition, because the groove 108a us disposed on the organic insulating layer 108 corresponding to the gate 106, an interval between the metal component 109 and the gate 106 subsequently formed in the groove 108a is narrow, and a capacitance of a capacitor consisted of the metal component 109 and the gate 106 is greater. A depth of the groove 108a is less than or equal to a thickness of the organic insulating layer 108. Specifically, the depth of the groove 108a is equal to the thickness of the organic insulating layer 108, so that the interval between the metal component 109 and the gate 106 is narrower, and the capacitance of the capacitor consisted of the metal component 109 and the gate 106 is greater. Because a size of the capacitor consisted of the metal component 109 and the gate 106 is approximately 20 μm×20 μm, a size of the groove 108a slightly greater than the size of the capacitor is conducive to a subsequent formation of the metal component 109.

A material of the organic insulating layer 108 comprises polyimide. After coating an entire surface of the organic insulating layer 108, the organic insulating layer 108 is directly exposed and developed (third photolithography process) to form the groove 108a. A thickness of the organic insulating layer 108 ranges from 0.5 micron to 3 microns. The metal component 109 is formed in the groove 108a and disposed corresponding to the gate 106. Due to the large number of thin film transistors comprised in the pixel driving circuit, a space for setting circuit devices is limited, and a space occupied by the capacitor is greater. A layout space of the circuit devices can be increased by adding the metal layer to form the metal component. The metal component 109 is configured as one electrode plate of the capacitor, the gate 106 of one thin film transistor in each pixel driving circuit is configured as the other electrode plate of the capacitor. The formed capacitor is a portion of the pixel driving circuit, and the pixel driving circuit is configured to control organic light-emitting diodes to emit light. An entire surface of the second metal layer is formed on a surface of the organic insulating layer 108 and in the groove 108a, and the second metal layer is patterned to form the metal component 109 and reset lines by a fourth photolithography process. A material and a composition of the metal component 109 are the same as those of the gate 106, and the metal component 109 comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer, in a bid to further improve performance of the capacitor consisted of the metal component 109 and the gate 106. A vertical projection of the metal component 109 on the substrate 101 covers a vertical projection of the gate 106 on the substrate 101, and a size of the metal component 109 is greater than a size of the gate 106. Since the size of the metal component 109 is greater than the size of the gate 106, the capacitance of the capacitor consisted of the metal component 109 and the gate 106 depends on the size of the gate 106, and a deviation of the formed metal component 109 will not affect the capacitance of the capacitor, so that the formed capacitor has more stable performance. If the size of the metal component 109 is exactly equal to or less than the size of the gate 106, due to deviations in a formation of the metal component 109, an overlapping size of the metal component 109 and the gate 106 changes, and a performance stability of the capacitor consisted of the two is poor.

Furthermore, at least two first openings 108b are defined on the organic insulating layer 108, and the at least two first openings 108b are defined corresponding to a portion of the source contact region 104a and a portion of the drain contact region 104b respectively which correspond to the active layer 104. The at least two first openings 108b are connected to the through-hole penetrating through the second insulating layer 110, the first insulating layer 105, and the inorganic insulating layer 107. The source 111 and the drain 1112 contact the portion of the source contact region 104a and the portion of the drain contact region 104b which correspond to the active layer 104 through the at least two first openings 108b and the through-hole penetrating through the second insulating layer, the first insulating layer, and the inorganic insulating layer respectively. The organic insulating layer corresponding to the source contact region 104a and the organic insulating layer corresponding to the drain contact region 104b are removed to prevent the through-hole for the source 1111 and drain 1112 contacting the active layer 104 subsequently from being too deep, which is conducive to the subsequently formed source 1111 and the drain 1112 be electrically connected to the active layer 104.

The second insulating layer 110 is an interlayer insulating layer. The second insulating layer 110 at least covers the metal component 109 and the organic insulating layer 108. When the at least two first openings 108b are disposed on the organic insulating layer 108, the second insulating layer 110 also covers the inorganic insulating layer 107. The second insulating layer 110 covers the organic insulating layer 108, the metal component 109, and a silicon oxide layer and a silicon nitride layer on the inorganic insulating layer 107 in sequence, wherein a thickness of the silicon oxide layer ranges from 2500 Å to 3500 Å, and a thickness of the silicon nitride layer ranges from 1600 Å to 2400 Å. After the second insulating layer 110 is formed, the through-hole penetrating through the second insulating layer 110, the first insulating layer 105, and the inorganic insulating layer 107 is formed by a fifth photolithography process, and the through-hole is located directly above the portion of the source contact region 104a and the portion of the drain contact region 104b corresponding to the active layer 104.

The source 1111 and the drain 1112 are formed on the second insulating layer 110 and are electrically connected to the active layer 104 at least through the through-hole penetrating through the second insulating layer 110, the first insulating layer 105, and the inorganic insulating layer 107. The source 1111 contacts the portion of the source contact region 104a corresponding to the active layer 104 through the through-hole, and the drain 1112 contacts the portion of the drain contact region 104b corresponding to the active layer 104 through the through-hole. A third metal layer is formed on the second insulating layer 110, and the third metal layer is patterned to form the source, the drain, and data lines by a sixth photolithography process. A material of the third metal layer comprises at least one of molybdenum, aluminum, titanium, copper, or silver. The third metal layer is formed by a sputtering process.

The planarization layer 112 is configured to planarize a surface of the substrate 101 on which the thin film transistors are formed, which is conducive to a subsequent formation of light-emitting devices formed on a planarized surface, so that the light-emitting devices emit light with a better light-emitting angle. A thickness of the planarization layer 112 ranges from 2.5 microns to 3 microns, the planarization layer is formed by spin coating or vapor deposition, and a material of the planarization layer 112 comprise polyimide. After forming an entire surface of the planarization layer, exposure and development (seventh photolithography process) are adopted to form through-hole on the planarization layer 112. The planarization layer 112 covers the source 1111, the drain 1112, and the second insulating layer 1110 and comprises the through-hole.

The anode 113 is formed on the planarization layer 112 and electrically contacts the drain 1112 through the through-hole on the planarization layer 112. A first conductive layer is formed on a surface of the planarization layer 112 and in the through-hole on the planarization layer 112, and the first conductive layer is patterned to the anode 113 by an eighth photolithography process. A material of the first conductive layer comprises at least one of indium tin oxide or metal.

The pixel definition layer 114 covers the anode 113 and the planarization layer 112. The pixel definition layer 114 comprises a second opening 114a, the second opening 114a is defined corresponding to the anode 113, and the second opening 114a is limited in a light-emitting region of the organic light-emitting diode display device 10. A longitudinal section of the second opening 114a is an inverted trapezoid. A thickness of the pixel definition layer 114 ranges from 1 micron to 2 microns. A material of the pixel definition layer 114 comprises polyimide. After coating an entire surface of the pixel definition layer, the pixel definition layer 114 is exposed and developed to form the second opening 114a.

The organic light-emitting layer 115 is formed in the second opening 114a and is located on the anode 113. The organic light-emitting layer 115 comprises a red organic light-emitting layer, a blue organic light-emitting layer, and a green organic light-emitting layer. Holes injected from the anode 113 into the organic light-emitting layer 115 and electrons injected from the cathode 116 into the organic light-emitting layer 115 excite the organic light-emitting layer to emit visible light. The cathode 116 at least covers the organic light-emitting layer 115, and the organic light-emitting layer 115 may share one cathode 116.

The light-emitting device layer comprises the anode, the organic light-emitting layer, and a cathode, and is formed on a side of the source and the drain away from the substrate.

The support component 117 is configured to support the mask plate, and the mask plate is configured to evaporate other layers such as the organic light-emitting layer, to prevent the mask plate and the pixel definition layer 114, etc. from direct contact, which may cause scratches on the organic light-emitting diode display device. A material of the support component 117 comprises polyimide, and a longitudinal section of the support component 117 is a trapezoid.

The organic light-emitting diode display device 10 further comprises a package layer (not shown in figures). The package layer is configured to encapsulate the organic light-emitting diodes to prevent the organic light-emitting layer and an active cathode from being corroded by contact with oxygen and water vapor. The package layer comprises a lamination of an inorganic layer and an organic layer to block oxygen and water vapor.

In the organic light-emitting diode display device of the present disclosure, the inorganic insulating layer is formed to cover the gate, and the organic insulating layer is formed on the inorganic insulating layer to perform a planarization function, which prevents the problem of metal residue occurring in the subsequently formed metal layer during etching due to the steep slope. The groove is defined on a position of the organic insulating layer corresponding to the gate, and the metal component is formed in the groove and disposed corresponding to the gate, so that an interval between the gate and the metal component is reduced and the capacitance of the capacitor consisted of the gate and the metal component is greater.

Figure 2:
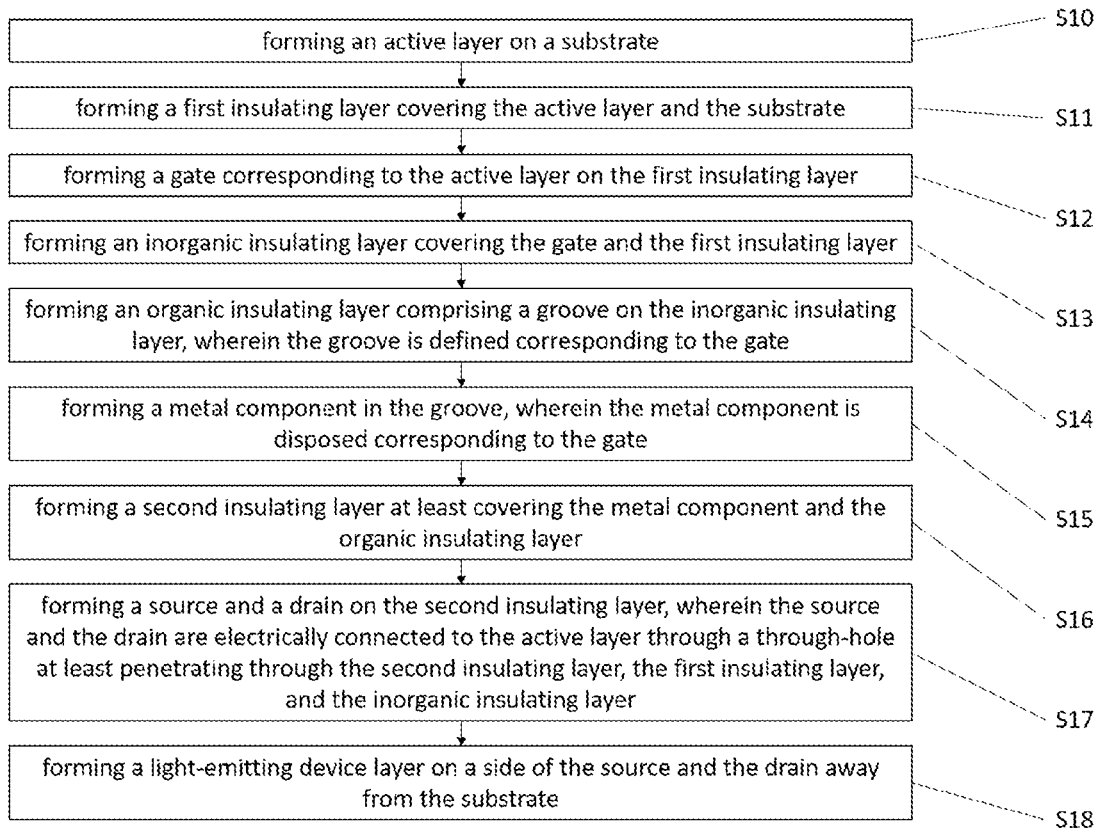
FIG. 2 is a flowchart of manufacturing the organic light-emitting diode display device shown in FIG. 1.

The present disclosure further provides a manufacturing method of the organic light-emitting diode display device. Refer to FIG. 2, FIG. 2 is a flowchart of manufacturing the organic light-emitting diode display device shown in FIG. 1. The manufacturing method comprises a plurality of steps as follows:

S10: forming an active layer on a substrate.

Figure 3A:
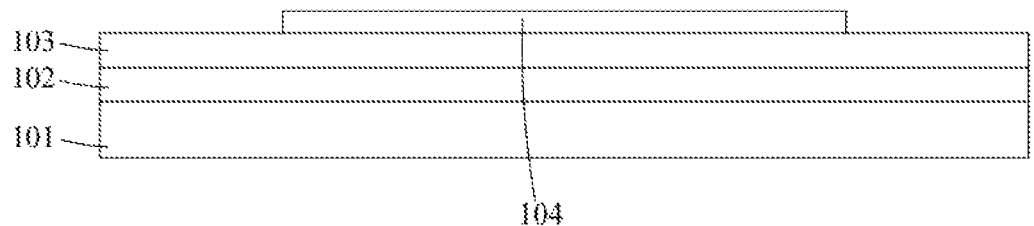
FIG. 3A to FIG. 3I are schematic diagrams of processes of manufacturing the organic light-emitting diode display device shown in FIG. 2.

Specifically, providing the substrate 101 comprising a blocking layer 102 and a buffer layer 103. An entire surface of the blocking layer 102 and an entire surface of the buffer layer 103 are laminated on the substrate 101 in sequence. An entire surface of amorphous silicon is formed on the buffer layer 103, the amorphous silicon is treated with excimer laser annealing (ELA) to convert the amorphous silicon to polysilicon, and the polysilicon is patterned to form the active layer by a first photolithography process, as shown in FIG. 3A.

S11: forming a first insulating layer covering the active layer and the substrate.

Figure 3B:
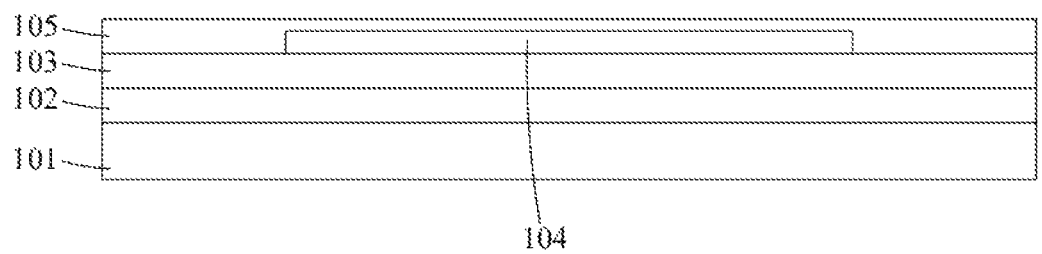

Specifically, forming the first insulating layer 105 covering the active layer 104 and the buffer layer 103 by one of chemical vapor deposition, vacuum evaporation, sputtering deposition, plasma enhanced chemical vapor deposition, or low-pressure chemical vapor deposition, as shown in FIG. 3B.

S12: forming a gate corresponding to the active layer on the first insulating layer.

Figure 3C:
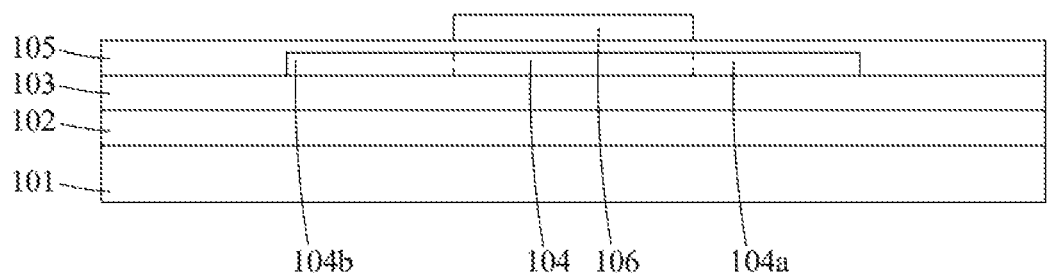

Specifically, forming an entire surface of a first metal layer on the first insulating layer 105 by sputtering deposition, and patterning the first metal layer to form the gate 106 and scanning lines by a second photolithography process. The active layer 104 is ion implanted with the gate 106 as a mask, so that a source contact region 104a and a drain contact region 104b are formed on both sides of the active layer 104, as shown in FIG. 3C.

Figure 3D:
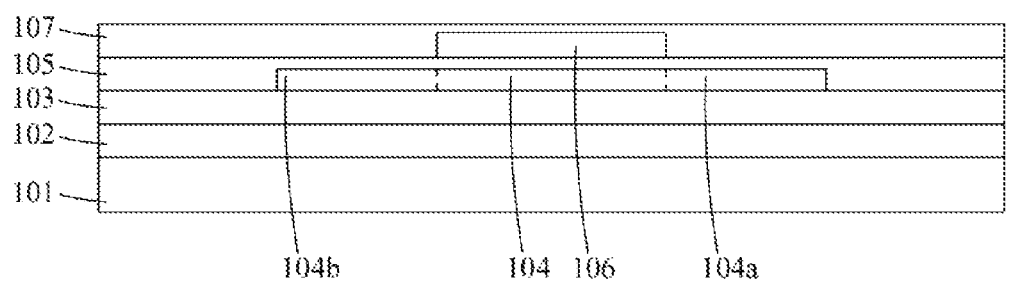

S13: forming an inorganic insulating layer 107 covering the gate 106 and the first insulating layer 105, as shown in FIG. 3D.

S14: forming an organic insulating layer 108 comprising a groove 108a on the inorganic insulating layer 107, and the groove 108a is defined corresponding to the gate 106.

Figure 3E:
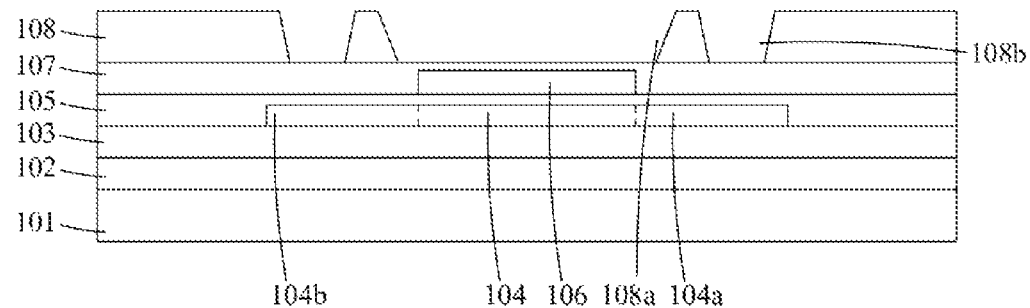

Specifically, after coating an entire surface of the organic insulating layer 108 on the inorganic insulating layer 107, the organic insulating layer 108 is directly exposed and developed (third photolithography process) to form the groove 108a, at least two first openings 108b are defined on the organic insulating layer 108 simultaneously, the at least two first openings 108b are defined corresponding to a portion of the source contact region 104a and a portion of the drain contact region 104b respectively which correspond to the active layer 104, and the groove 108a is defined corresponding to the gate 106, as shown in FIG. 3E.

Figure 3F:
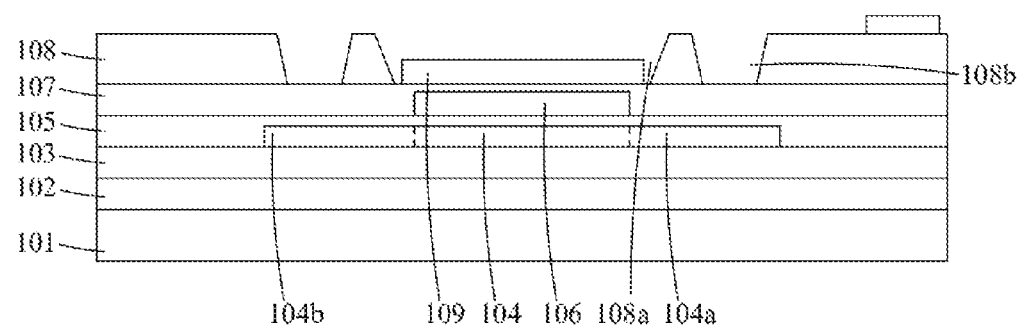

S15: forming a metal component 109 in the groove 108a, and the metal component 109 is disposed corresponding to the gate 106, as shown in FIG. 3F.

S16: forming a second insulating layer 110 at least covering the metal component 109 and the organic insulating layer 108.

Figure 3G:
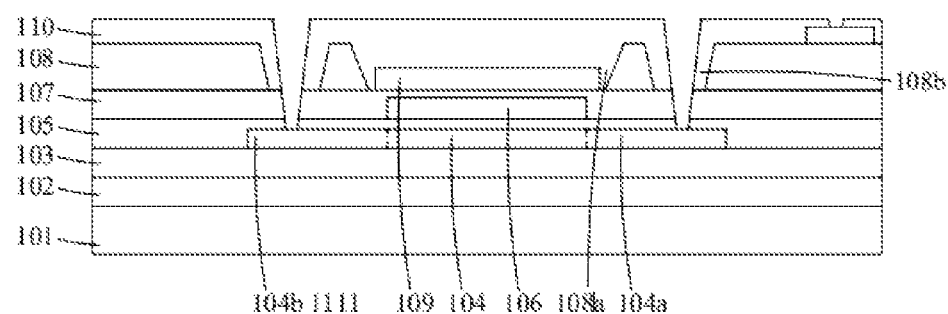

Specifically, forming the second insulating layer 110 covering the metal component 109 and the organic insulating layer 108 by chemical deposition or the like. After the second insulating layer 110 is formed, a through-hole penetrating through the second insulating layer 110, the first insulating layer 105, and the inorganic insulating layer 107 is formed by a fifth photolithography process, and the through-hole is located directly above the portion of the source contact region 104a and the portion of the drain contact region 104b corresponding to the active layer 104, as shown in FIG. 3G.

Figure 3H:
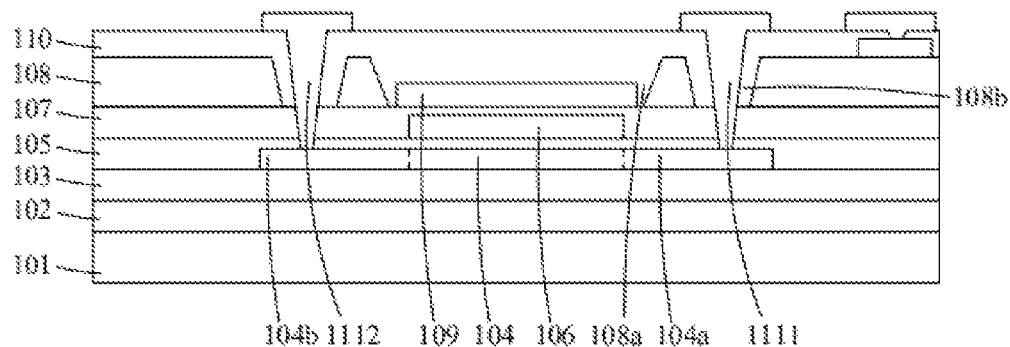

S17: forming a source and a drain on the second insulating layer, and the source and the drain are electrically connected to the active layer 104 through the through-hole at least penetrating through the second insulating layer 110, the first insulating layer 105, and the organic insulating layer 107, as shown in FIG. 3H.

S18: forming a light-emitting device layer on a side of the source 1111 and the drain 1112 away from the substrate 101.

Figure 3I:
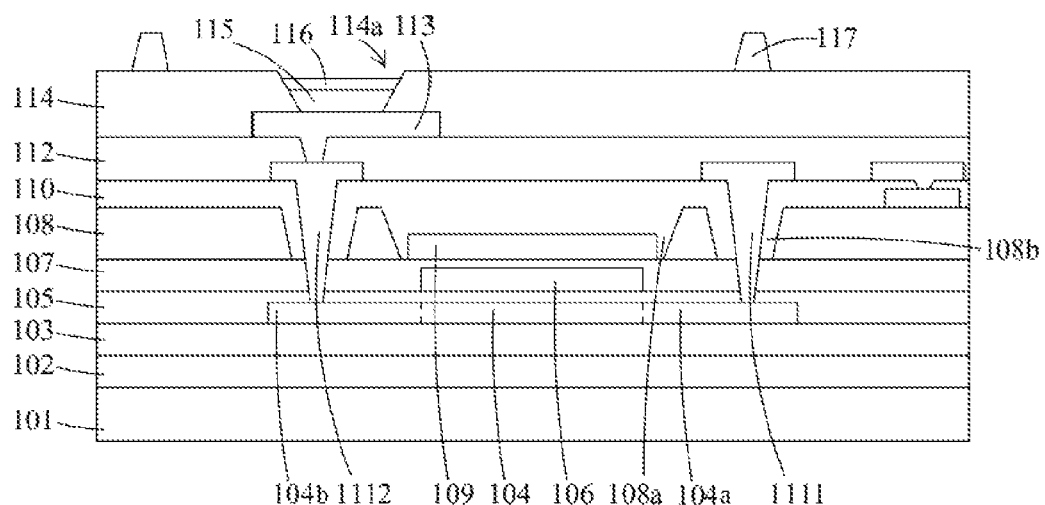

Specifically, forming a planarization layer 112 covering the source 1111, the drain 1112, and the second insulating layer 1110 and comprising the through-hole. Forming the anode 113 on the planarization layer 112, wherein the anode is electrically connected to the drain 1112 through the through-hole on the planarization layer 112. Forming a pixel definition layer 114 covering the anode 113 and the planarization layer 112 and comprising a second opening 114a, wherein the second opening 114a is defined corresponding to the anode 113. Forming a support component 117 on the pixel definition layer 114. Forming an organic light-emitting layer 115 in the second opening 114a, wherein the organic light-emitting layer 115 is located on the anode 113. Forming a cathode 116 at least covering the organic light-emitting layer 115, wherein the light-emitting device layer comprises the anode 113, the organic light-emitting layer 115, and the cathode 116, as shown in FIG. 3I.

In the present embodiment, a depth of the groove 108a is equal to a thickness of the organic insulating layer 108, so that an interval between the metal component 109 and the gate 106 is smaller, and the capacitance of the capacitor consisted of the metal component 109 and the gate 106 is greater.

In the present embodiment, a thickness of the inorganic insulating layer 107 ranges from 500 Å to 2000 Å, and the inorganic insulating layer 107 is a silicon nitride layer.

In the present embodiment, a vertical projection of the metal component 109 on the substrate 101 covers a vertical projection of the gate 106 on the substrate, and a size of the metal component 109 is greater than a size of the gate 106.

In the present embodiment, the active layer 104 comprises a source contact region 104a and a drain contact region 104b arranged symmetrically with the source contact region. At least two first openings 108b are defined on the organic insulating layer 108, and the at least two first openings 108b are defined corresponding to a portion of the source contact region 104a and a portion of the drain contact region 104b respectively which correspond to the active layer. The at least two first openings 108b are connected to the through-hole penetrating through the second insulating layer 110, the first insulating layer 105, and the inorganic insulating layer 107. The source 111 and the drain 1112 contact the portion of the source contact region 104a and the portion of the drain contact region 104b which correspond to the active layer 104 through the at least two first openings and the through-hole penetrating through the second insulating layer 110, the first insulating layer 105, and the inorganic insulating layer 107 respectively.

In the present embodiment, a longitudinal section of the groove 108a is an inverted trapezoid.

In the present embodiment, a thickness of the organic insulating layer 108 ranges from 0.5 micron to 3 microns.

In the present embodiment, the gate 106 comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer, and the metal component 109 comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer.

In the manufacturing method of the organic light-emitting diode display device of the embodiment of the present disclosure, forming the inorganic insulating layer covering the gate, and forming the organic insulating layer on the inorganic insulating layer to perform a planarization function, which prevents the problem of metal residue occurring in the subsequently formed metal layer during etching due to the steep slope. The groove is defined on a position of the organic insulating layer corresponding to the gate, and the metal component is formed in the groove and disposed corresponding to the gate, so that an interval between the gate and the metal component is reduced and the capacitance of the capacitor consisted of the gate and the metal component is greater.

The descriptions of the above embodiments are only used to help understand technical solutions of the present disclosure and core ideas thereof. Moreover, those of ordinary skill in the art should understand that the technical solutions described in the aforesaid embodiments can still be modified, or have some technical features equivalently replaced. However, these modifications or replacements do not depart from a scope of the technical solutions of the embodiments of the present disclosure.

What is claimed is:

1. An organic light-emitting diode display device, comprising:
   a substrate;
   an active layer formed on the substrate;
   a first insulating layer covering the active layer and the substrate;
   a gate opposite to the active layer and formed on the first insulating layer;
   an inorganic insulating layer covering the gate and the first insulating layer;
   an organic insulating and planarization layer comprising a groove and formed on the inorganic insulating layer, wherein the groove is opposite to the gate and concave toward the gate;
   a metal component formed in the groove and opposite to the gate;
   a second insulating layer at least covering the metal component and the organic insulating and planarization layer;
   a source and a drain formed on the second insulating layer and electrically connected to the active layer through a through-hole at least penetrating through the second insulating layer, the first insulating layer, and the inorganic insulating layer; and
   a light-emitting device layer formed on a side of the source and the drain away from the substrate.

2. The organic light-emitting diode display device as claimed in claim 1, wherein a depth of the groove is equal to a thickness of the organic insulating and planarization layer.

3. The organic light-emitting diode display device as claimed in claim 1, wherein a thickness of the inorganic insulating layer ranges from 500 Å to 2000 Å, and the inorganic insulating layer is a silicon nitride layer.

4. The organic light-emitting diode display device as claimed in claim 1, wherein a vertical projection of the metal component on the substrate covers a vertical projection of the gate on the substrate, and a horizontal size of the metal component is greater than a horizontal size of the gate.

5. The organic light-emitting diode display device as claimed in claim 1, wherein the active layer comprises a source contact region and a drain contact region arranged symmetrically with the source contact region;
   at least two first openings are defined on the organic insulating and planarization layer, and the at least two first openings are defined corresponding to a portion of the source contact region and a portion of the drain contact region respectively which correspond to the active layer;

the at least two first openings are connected to the through-hole penetrating through the second insulating layer, the first insulating layer, and the inorganic insulating layer; and the source and the drain contact the portion of the source contact region and the portion of the drain contact region which correspond to the active layer through the at least two first openings and the through-hole penetrating through the second insulating layer, the first insulating layer, and the inorganic insulating layer respectively.

6. The organic light-emitting diode display device as claimed in claim 1, wherein a longitudinal section of the groove is an inverted trapezoid.

7. The organic light-emitting diode display device as claimed in claim 1, wherein a thickness of the organic insulating and planarization layer ranges from 0.5 micron to 3 microns.

8. The organic light-emitting diode display device as claimed in claim 1, wherein the gate comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer; and the metal component comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer.

9. The organic light-emitting diode display device as claimed in claim 1, wherein the light-emitting diode display device comprises a planarization layer and a pixel definition layer, the light-emitting device layer comprises an anode, an organic light-emitting layer, and a cathode, the planarization layer covers the source, the drain, and the second insulating layer and comprises the through-hole;

the anode is formed on the planarization layer and electrically contacts the drain through the through-hole on the planarization layer;

the pixel definition layer covers the anode and the planarization layer and comprises a second opening, and the second opening is defined corresponding to the anode;

the organic light-emitting layer is formed in the second opening and is located on the anode; and the cathode at least covers the organic light-emitting layer.

10. A manufacturing method of an organic light-emitting diode display device, comprising a plurality of steps as follows:

forming an active layer on a substrate;

forming a first insulating layer covering the active layer and the substrate;

forming a gate opposite to the active layer on the first insulating layer;

forming an inorganic insulating layer covering the gate and the first insulating layer;

forming an organic insulating and planarization layer comprising a groove on the inorganic insulating layer, wherein the groove is opposite to the gate and concave toward the gate;

forming a metal component in the groove, wherein the metal component is opposite to the gate;

forming a second insulating layer at least covering the metal component and the organic insulating and planarization layer;

forming a source and a drain on the second insulating layer, wherein the source and the drain are electrically connected to the active layer through a through-hole at least penetrating through the second insulating layer, the first insulating layer, and the inorganic insulating layer; and forming a light-emitting device layer on a side of the source and the drain away from the substrate.

11. The manufacturing method of the organic light-emitting diode display device as claimed in claim 10, wherein a depth of the groove is equal to a thickness of the organic insulating and planarization layer.

12. The manufacturing method of the organic light-emitting diode display device as claimed in claim 10, wherein a thickness of the inorganic insulating layer ranges from 500 Å to 2000 Å, and the inorganic insulating layer is a silicon nitride layer.

13. The manufacturing method of the organic light-emitting diode display device as claimed in claim 10, wherein a vertical projection of the metal component on the substrate covers a vertical projection of the gate on the substrate, and a horizontal size of the metal component is greater than a horizontal size of the gate.

14. The manufacturing method of the organic light-emitting diode display device as claimed in claim 10, wherein the method comprises a following step:

defining at least two first openings on the organic insulating and planarization layer, wherein the at least two first openings are defined corresponding to a portion of a source contact region and a portion of the drain contact region respectively which correspond to the active layer, and the active layer comprises the source contact region and the drain contact region arranged symmetrically with the source contact region.

15. The manufacturing method of the organic light-emitting diode display device as claimed in claim 10, wherein a longitudinal section of the groove is an inverted trapezoid.

16. The manufacturing method of the organic light-emitting diode display device as claimed in claim 10, wherein a thickness of the organic insulating and planarization layer ranges from 0.5 micron to 3 microns.

17. The manufacturing method of the organic light-emitting diode display device as claimed in claim 10, wherein the gate comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer; and the metal component comprises one of an aluminum layer, an aluminum alloy layer, a lamination of the aluminum layer and a titanium layer, a lamination of the aluminum alloy layer and the titanium layer, or a lamination of the aluminum alloy layer and a TiNx layer.

18. The manufacturing method of the organic light-emitting diode display device as claimed in claim 10, wherein the method comprises following step:

forming a planarization layer comprising the through-hole and covering the source, the drain, and the second insulating layer;

wherein the step of forming the light-emitting device layer on the side of the source and the drain away from the substrate comprises following step:

forming an anode on the planarization layer, wherein the anode is electrically connected to the drain through the through-hole;

wherein the method further comprises following step:

forming a pixel definition layer comprising a second opening and covering the anode and the planarization layer, wherein the second opening is defined corresponding to the anode;

wherein the step of forming the light-emitting device layer on the side of the source and the drain away from the substrate further comprises a plurality of steps as follows:

forming the organic light-emitting layer in the second opening, wherein the organic light-emitting layer is located on the anode; and forming a cathode at least covering the organic light-emitting layer.

* * * * *